United States Patent [19]

White et al.

[11] Patent Number: 4,615,573
[45] Date of Patent: Oct. 7, 1986

[54] SPRING FINGER INTERCONNECT FOR IC CHIP CARRIER

[75] Inventors: William J. White, Chelmsford; James M. Ortolf, Acton, both of Mass.

[73] Assignee: Honeywell Inc., Minneapolis, Minn.

[21] Appl. No.: 794,179

[22] Filed: Nov. 1, 1985

Related U.S. Application Data

[63] Continuation of Ser. No. 546,257, Oct. 28, 1983, abandoned.

[51] Int. Cl.[4] .............................................. H01R 9/09
[52] U.S. Cl. .................................. 339/17 M; 29/843; 361/405
[58] Field of Search ................. 29/842, 843, 846, 832; 357/69, 70; 361/402–406; 339/17 M, 17 N, 17 CF

[56] References Cited

U.S. PATENT DOCUMENTS

| | | | |
|---|---|---|---|
| 3,723,943 | 3/1973 | Hotze | 339/17 CF |
| 3,984,166 | 10/1976 | Hutchison | 339/17 CF |
| 3,997,963 | 12/1976 | Riseman | 357/69 |
| 4,018,491 | 4/1977 | Niedzwiecke et al. | 339/17 CF |
| 4,239,312 | 12/1980 | Myer et al. | 339/49 B |

FOREIGN PATENT DOCUMENTS 1171655  11/1969  United Kingdom ........... 339/17 CF

OTHER PUBLICATIONS

Metal–Elastomer Connections, Buchoff, Eleventh Annual Connector Symposium Proceedings, pp. 36–43, Oct. 1978.

Primary Examiner—Neil Abrams
Attorney, Agent, or Firm—John S. Solakian; Albin Medved

[57] ABSTRACT

Apparatus and method for electrically interconnecting two integrated circuit boards, which includes spring finger contact pads positioned on one board which are matched to raised contact pads on a second board in a manner such that the assembly is easily disassembled and reconnectable and such that it provides for exact height registration between boards. Accurate height registration is required when, for example, an electro-optical device referenced with respect to an optical system is mounted on one of the circuit boards.

8 Claims, 7 Drawing Figures

SPRING FINGER INTERCONNECT FOR IC CHIP CARRIER

The Government has rights in this invention pursuant to Contract No. F04701-81-C-0035 awarded by the Department of the Air Force.

This application is a continuation of application Ser. No. 546,257, filed 10-28-83 and now abandoned.

BACKGROUND OF THE INVENTION

The present invention relates to integrated circuit chip carrier devices, and, more particularly, to an apparatus and method for making electrical connection with a mother electronics board or other electronic assembly.

In the past, integrated circuit chip packages (or carriers) have employed pin and socket pairs to electrically connect the input/output ports of the integrated circuit with the input/output ports of the mother board or recipient electronic assembly. These pin and socket pairs have generally consisted of batch fabricated pins brazed to electrical contacts on the side of the chip carrier substrate, as well as matching batch fabricated socket receptors which are mounted to the recipient electronic assembly. In a more recent technology, the "Pin Grid Array" technology, individual pin and socket pairs have been fabricated and soldered to input/output ports of the chip carrier and mother board, respectively.

Both of these designs have the disadvantages that they require large substrates for support of the interconnectors, and that, as a result, the chip carrier must be substantially larger than the integrated circuit itself. These chip carriers have the further disadvantage that it is difficult to obtain accurate and repeatable height control of the top surface of the integrated circuit. This is particularly critical where electro-optical detection devices are mounted on the integrated circuit, and accurate height control is necessary to ensure proper focusing of the device. Pin connectors have the additional disadvantage since it is not possible to make any significant lateral adjustment in position once the pin positions have been determined.

Accordingly, it is a primary object of the present invention to provide an improved interconnect mechanism for an integrated circuit chip carrier which is compact in size, easily reconnectable, and which provides an accurate and reproducible means of integrated circuit height control and lateral position.

SUMMARY OF THE INVENTION

The above and other objects of the present invention are achieved by providing an improved apparatus and method for making electrical contact between two surfaces and an improved method for making such apparatus, in which the apparatus is easily disassembled and which does not need pin and socket pairs. The improved interconnect assembly includes a pattern of spring finger members mounted on the first circuit board, for example, an electronic mother board, which connects to a matching set of bump contact pads on the second circuit board, for example, a detector focal plane array and substrate. Each spring finger mechanism comprises a thin conductive spring which is attached to the first circuit board by a conductive bump pad. The distance between circuit boards is controlled by precise deposition of the required thickness of the bump contact material. This may be achieved, for example, by plating or some similar well-known metalization or deposition technique.

BRIEF DESCRIPTION OF THE DRAWINGS

The above and other objects of the present invention are achieved in the illustrative embodiment with respect to the Figures in which.

DETAILED DESCRIPTION OF THE PREFERRED EMBODIMENT(S)

Figure 1:
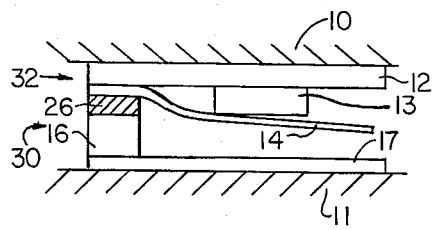
FIG. 1 shows a side view of the present invention.

Referring to FIG. 1, for each desired electrical contact between circuitry on circuit boards 10 and 11, the apparatus of the present invention includes a spring finger assembly 30 mounted on board 11, and a matched contact pad assembly 32 mounted on the second circuit board 10. The spring finger assembly 30 comprises a contact pad 17 applied directly to the surface of board 11, a bump pad 16 applied to one end of pad 17 and a strap spring finger 14 attached to bump pad 16 by solder 26 or other electrically conductive contact means. The height of spring finger assembly 30 is controlled by forming or delineating the pad 17 and spring finger 14 from thin sheet materials of known thickness, and by adjusting the height of bump pad 16, which is plated onto pad 17. The matched contact pad assembly 32 on board 10 comprises a similar formed or delineated contact pad 12 onto which a bump pad 13 is plated.

Figure 2:
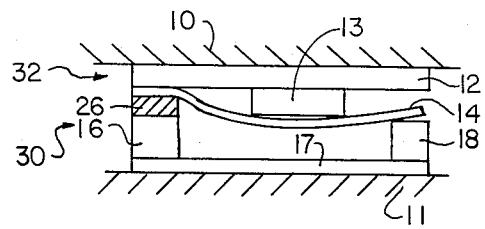
FIG. 2 shows a side view of an alternate embodiment of the present invention.

In an alternate embodiment as shown in FIG. 2, a second contact pad 18 may be affixed to pad 17 in order to increase the area of electrical contact between spring finger assembly 30 and matched contact pad assembly 32 and also to increase the amount of spring force in strap spring finger 14. Boards 10 and 11 might then be attached to one another by some other well-known technique, for example, by a threaded sleeve and screw assembly. The materials for the screw and sleeve may be selected to maintain contact when the apparatus is at cryogenic temperature.

The following is a description of the fabrication of the spring finger apparatus of the present invention. The dimensions and materials given are for one embodiment in accordance with the principles of the present invention. It is understood, however, that other materials or procedures which produce similar results might be substituted.

Figure 3A:
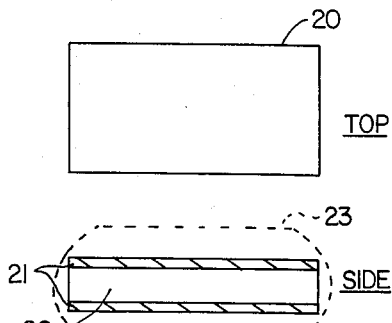
FIGS. 3A through 3E show side and top views of various stages of manufacture of the subject invention.
Figure 3B:
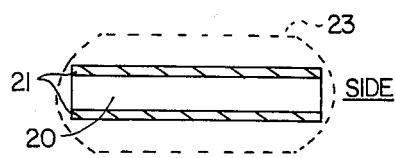
Figure 3B:
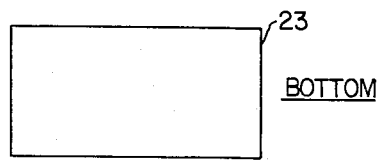
Figure 3D:
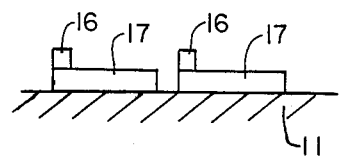
Figure 3E:
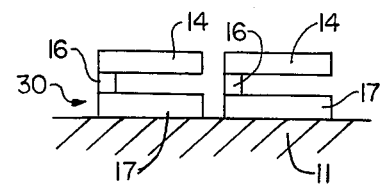
Figure 3C:
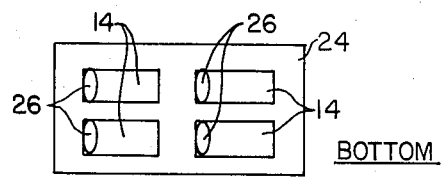
Figure 3C:
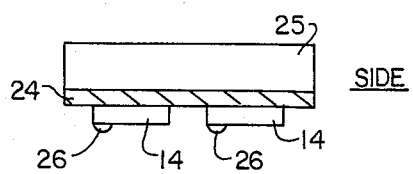

Now referring to FIGS. 3A through 3E, a thin (approximately 0.001–0.002 inches thick) beryllium copper (BeCu) sheet 20 is plated on both sides with layers of gold 21 (approximately each 50–100 micro-inches thick) in order to improve conduction properties and to reduce surface oxidation. This composite sheet 23 is laminated to a temporary carrier 25, using a removable adhesive, which is shown as layer 24 in FIG. 3B. The composite sheet 23 is then delineated to form the spring fingers 14, using the well-known technique of photoresist/acid etching or machining. Typically, these might be made approximately 0.010 to 0.030 inches square. As shown in FIG. 3C, solder dots 26 are deposited on the end of each of the spring fingers for later attachment to the circuit board assembly via bump pad 16 and contact pad 17.

A set of contact pads 17, positioned to couple with fingers 14 are prepared on circuit board 11. In one embodiment, contact pads 17 may comprise a section of the cofired printed circuitry on the surface of board 11, or the terminus of a via through circuit board 11. In a second embodiment, pad 17 might be plated, screened or photodeposited directly on the surface of board 11 by any well-known technique.

In either case, copper bump pads 16 (approximately 0.001-0.002 inches thick) are formed, for example by plating, at the end of pads 17. Pads 16 are in registration with the locations of the solder dots 26 on spring fingers 14. In an alternative embodiment, as shown in FIG. 2, a second pad 18 may be formed at the opposite end of pad 17 to increase the area of electrical contact between each interconnect, and to increase the amount of spring force in strap spring finger 14.

Temporary carrier sheet 25 bearing spring fingers 14 with solder dots 26 is positioned over first circuit board 11 which bears pads 17. If necessary, bump pads 16 may be tinned to promote even heat flow during soldering. Pads 16 and spring fingers 14 are brought into contact and heated to cause solder 26 to flow. Forming gas or flux may also be used when heating the solder dots 26. The temporary carrier 25 may then be removed by either an etch process or some dissolution of the adhesive 24. The complete spring finger mechanism is left in place on board 11 as shown in FIG. 3E.

The matched contact pad assembly 32 which will be located on the second circuit board 10 may be prepared in several ways. In one embodiment, contact pad assembly 32 might be prepared by any of the techniques described for fabrication of contact pads 17 and bump pads 16.

In some electronic assemblies it is necessary to maintain exact height registration between boards 10 and 11. As an example, board 10 might carry an infrared detector or other electro-optical assembly (not shown) whose surface must be precisely aligned both vertically and laterally with respect to some optical imaging system (also not shown). Because the pads 12, 16 and 17 are plated or photodeposited and spring fingers 14 are of a known and consistent thickness, the present invention has the advantage that the height of board 10 above board 11 is controlled by the precise thickness of elements 12, 14, 16 and 17. The factor controlling accurate height registration is the contact between pad 12 and spring finger 14 above pad 16. One embodiment of the present invention might be used to form interconnects for IC chip carriers, as described in a patent application entitled "INTEGRATED CIRCUIT CHIP CARRIER", filed on even date herewith, and assigned to the same assignee as that of the present invention.

A second advantage of the present invention is that the lateral position of board 10 on board 11 may be adjusted and thereafter maintain contact between spring finger assembly 30 and contact pad assembly 32. The thickness of solder dot 26 is shown out of proportion in the Figures, however, it is understood that the thickness of solder 26 is substantially small with respect to elements 12, 13, 14, 16 and 17, and does not affect the vertical height registration capability of the present invention.

Having described the invention, what is claimed as new and novel and for which it is desired to secure Letters Patent is:

1. An electrical interconnect apparatus for connecting electrical circuits on first and second circuit boards, said apparatus comprising:
    A. a miniaturized area array of spring finger contact assemblies, each of said assemblies comprising
        (i) a first electrically conductive contact pad positioned on said first circuit board;
        (ii) a first electrically conductive bump pad attached to said first contact pad such that said first bump pad is located substantially at one end of said first contact pad; and
        (iii) an electrically conductive flexible contact finger having first and second ends, said first end attached to said first bump pad, said second and being free to move;
    B. a miniaturized area array of electrical contact pad assemblies, each of said assemblies comprising a raised electrical second contact pad coupled to said second circuit board in order to provide an electrical conducting path from said electrical circuit on said first circuit board through said spring finger assembly and through said electrical contact pad assembly to said electrical circuit on said second circuit board;
    C. a second electrically conductive bump pad coupled to said first contact pad such that said second bump pad is located substantially in a spaced relationship with said first bump pad on said first contact pad, and wherein said second bump pad is positioned between said contact finger and said first contact pad in order to increase the electrical contact area of said interconnect apparatus and to provide spring force on said conductive flexible contact finger; and
    D. wherein said second end of said contact finger is separably engagable with said second bump pad.

2. An apparatus as in claim 1 wherein said contact finger comprises a high conductance material having spring-like characteristics.

3. Apparatus as in claim 1 wherein the amount of said spring force may be increased by increasing the thickness of said second bump pad.

4. An apparatus as in claim 2 wherein said contact finger further comprises a piece of beryllium copper (BeCu) which has been gold plated to improve the electrical conductance of said contact finger.

5. An apparatus as in claim 1 wherein said first bump pad comprises a high electrically conductive material coupled to said first contact pad.

6. An apparatus as in claim 1 wherein said first and second contact pads comprise a high electrical conductance material.

7. An apparatus as in claim 1 wherein said second contact pad comprises copper material which has been electrodeposited on said second contact pad.

8. An apparatus as in claim 1 wherein said third bump pad comprises copper material which has been photodeposited on said first contact pad.

* * * * *